United States Patent [19]

Scott et al.

[11] Patent Number: 4,754,314

[45] Date of Patent: Jun. 28, 1988

[54] SPLIT-LEVEL CMOS

[75] Inventors: David B. Scott, Plano; Satwinder S. Malhi, Garland, both of Tex.

[73] Assignee: Texas Instruments Incorporated, Dallas, Tex.

[21] Appl. No.: 9,004

[22] Filed: Jan. 28, 1987

Related U.S. Application Data

[63] Continuation of Ser. No. 573,529, Jan. 24, 1984, abandoned.

[51] Int. Cl.⁴ .................... H01L 27/02; H01L 29/78; H01L 29/04
[52] U.S. Cl. .................... 357/42; 357/23.7; 357/59
[58] Field of Search .................... 357/42, 23.7, 59 E, 357/59 G, 59 K

[56] References Cited

U.S. PATENT DOCUMENTS 4,333,099  6/1982  Tanguay et al. .................... 357/59
4,472,729  9/1984  Shibata et al. .................... 357/59

FOREIGN PATENT DOCUMENTS 54-97384  8/1979  Japan .................... 357/23.7
57-43455  3/1982  Japan .................... 357/42

Primary Examiner—Martin H. Edlow
Assistant Examiner—Robert P. Limanek
Attorney, Agent, or Firm—Rodney M. Anderson; Leo N. Heiting; Melvin Sharp

[57] ABSTRACT

A CMOS device wherein the NMOS devices are bulk devices and the PMOS devices are SOI devices. The PMOS devices are formed with their channel regions in a silicon-on-insulator layer, preferably a laterally recrystallized annealed-polysilicon layer over a silicon dioxide layer.

6 Claims, 2 Drawing Sheets

SPLIT-LEVEL CMOS

This application is a continuation of application Ser. No. 573,529, filed Jan. 24, 1984, now abandoned.

BACKGROUND AND SUMMARY OF THE INVENTION

The present invention relates to CMOS devices.

Latch-up has been a chronic problem in the CMOS art, and is predicted to become a much greater problem as CMOS devices are reduced to smaller and smaller dimensions. Latch-up results from the operation of a parasitic bipolar device, i.e. a bipolar device which is not intentionally designed as part of the circuit, but which in fact results from the device structures as fabricated. For example, in N-well CMOS technology, an N+ source/drain region and a P+ source/drain region will be separated by a portion of the N-well and of the P-substrate. This NPNP device can be considered as a thyristor, and, with the small device spacing which is preferable for integrated circuits, this NPNP device will in fact fire as a thyristor at levels of injection current which may easily be achieved. Thus, any time a large potential difference exists between neighboring N+ and P+ regions, the parasitic thyristor may turn on and pass very large currents, which may cause a stuck logic condition or may destroy the CMOS device. This condition is known as latch-up.

The prior art has sought to reduce the gain of the parasitic thyristor or to avoid its ever getting a sufficient injection current to turn on. However, the present invention avoids latch-up in a new way: in the present invention, the parasitic thyristor does not exist, since the N-channel and P-channel devices are not both fabricated in the substrate.

That is, in the present invention one device type (preferably the PMOS) is fabricated as SOI devices rather than as bulk devices. This means that the NMOS and PMOS devices do not in general share this same substrate. Thus, although a diode may exist where the P+ regions butt up against the N+ regions, there is no current path for a thyristor structure to exist.

In particular, in the presently preferred embodiment, well implants into the bulk are not necessary. Thus it is possible to use the P+ and N+ regions as conductors, and a P+ to N+ contact requires only a merged contact with a spot of metal to bridge the P+ to N+ diode. Since thyristor action is prevented, the PMOS and NMOS devices can be placed closer together and higher total density results.

According to the present invention there is provided:
A CMOS integrated circuit, comprising:
a monolithic semiconducting substrate;
a plurality of N-channel insulated-gate-field-effect transistors formed in said substrate;
a plurality of P-channel silicon-on-insulator insulated-gate-field-effect transistors formed atop said substrate; and
means for interconnecting said N-channel and P-channel transistors to embody a predetermined circuit function.

BRIEF DESCRIPTION OF THE DRAWINGS

The present invention will be described with reference to the accompanying drawings, which are hereby incorporated by reference as a portion of the present specification, wherein.

DESCRIPTION OF THE PREFERRED EMBODIMENTS

Figure 1:
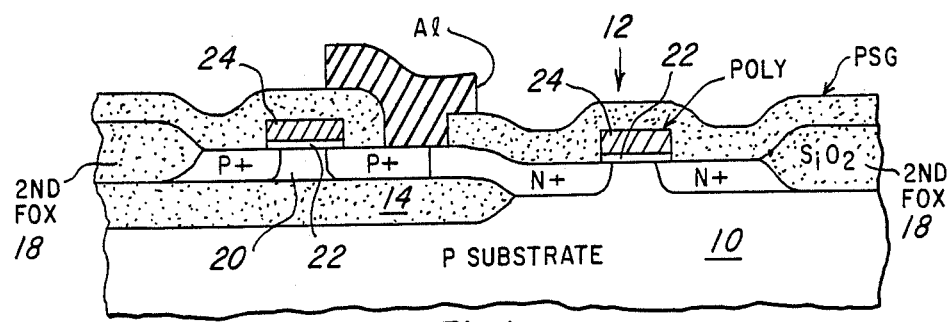
FIG. 1 shows a sample SOI CMOS device of the present invention.
Figure 2A:
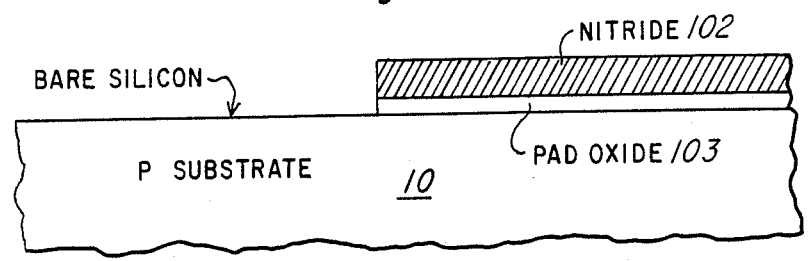
FIGS. 2a through 2e show successive steps in fabrication of the embodiment of FIG. 1.
Figure 2B:
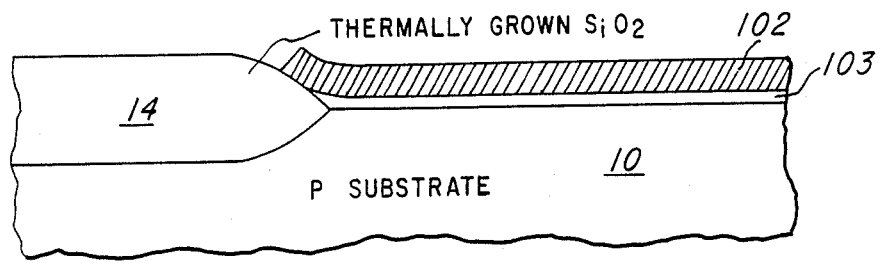
Figure 2C:
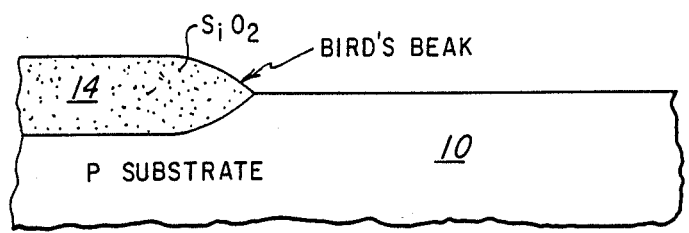
Figure 2D:
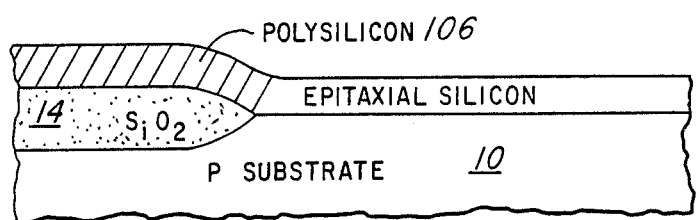
Figure 2E:
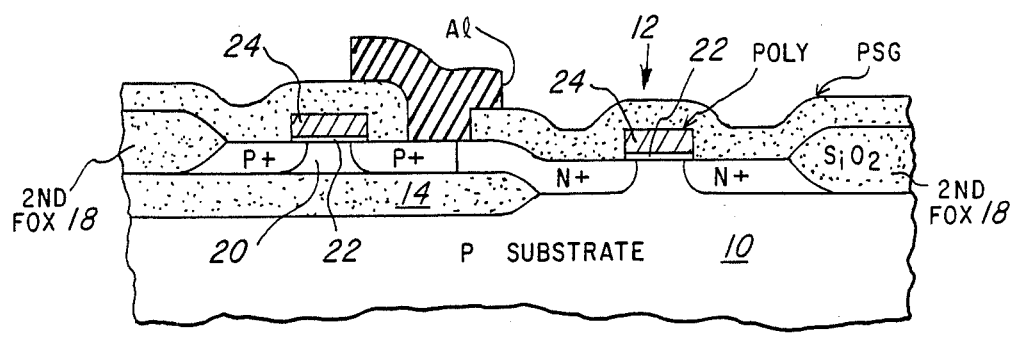

The presently preferred embodiment will be described first in some detail, and modifications thereof will then be discussed.

A single-crystalline silicon substrate 10 is provided. The doping of the substrate is unimportant, but will be discussed below.

First, the moat regions 12 are provided, preferably by conventional LOCOS. For example, a thin oxide may be grown for stress relief, a nitride layer deposited and patterned, a channel stop ion implant performed (e.g. $4 \times 10^{12}$ per square centimeter of boron at fairly low energy), and the first field oxide 14 grown. The first field oxide can be grown in a wide range of thicknesses, e.g. ½ to 1.1 microns.

A first polysilicon layer 16, comprising undoped polysilicon, is then deposited. In the presently preferred embodiment this is about a half micron of polycrystalline silicon. This is deposited by chemical vapor deposition methods, as well known to those skilled in the art.

Note that this polysilicon layer 16 is both in contact with the substrate 10 and also runs up over the field oxide 14. For this reason, it is desirable that the first field oxide 14 be fabricated by LOCOS methods, to achieve a smooth transition of the polysilicon from the substrate up onto the field oxide 14. The thickness of the nitride mask is preferably 140 nanometers, but may be varied.

This polysilicon layer is then annealed to form device quality silicon. This is done preferably using the following annealing conditions, although a wide variety of others may be used, as is well known to those skilled in the art: a scanning argon ion laser, having a total power of about 10 in over a spot size about 80 microns wide, is scanned at 10 cm/sec. Alternatively, amorphons silicon can be deposited followed by a solid-phase-epitaxy anneal (e.g. at 600 degrees C.) to achieve recrystallization.

Next, the second field oxide 18 is grown, for isolation of PMOS devices from each other, and for isolation of PMOS from NMOS devices. This second field oxide layer 18 is again preferably grown by LOCOS methods. However, the small thickness of the polysilicon layer 16 means that the second field oxide will only be grown to a moderate thickness, e.g. 1.1 microns, since the polysilicon layer 16 must be consumed to provide the oxide for this second field oxide.

Next, a masked implant is preferably performed to dope the channel regions 20 of the PMOS devices. This implant may be, for example, 5E11 per square centimeter of phosphorous. Next, a blanket implant is preferably performed to adjust the threshold voltages of both the NMOS and PMOS devices. This implant would typically be 2 or 3E11 per square centimeter of boron.

Next, a gate oxide 22 is preferably grown over both the NMOS and PMOS devices. In the presently preferred embodiment, this gate oxide 22 is grown 500 angstroms thick. This thickness can of course be widely varied, as is well known to those skilled in the art. Preferably, as is also well known, a sacrifical oxide may be grown and then etched away before the gate oxide is grown.

Next the second poly layer 24 is deposited, doped, and patterned, to provide the gates of the NMOS and PMOS devices. This second polysilicon layer may be, for example, ½ micron thick, and $POCl^3$ doped to provide good conductivity. The remainder of processing is essentially conventionally. That is, source/drain ion implants are performed (either separately, using 2 masks, or using source/drain counter doping, using 1 mask). An interlevel insulator, such as PSG is deposited and preferably planarized. Another mask level is used for contacts, another mask level is used for metal, and another mask level is used for overcoat (also referred to as POR).

The foregoing process flow does not provide first contacts, but those can easily be added if desired, simply by inserting a extra mask level.

The presently preferred embodiment places the PMOS devices on the oxide and the NMOS devices in bulk. This is because of the sign of the trapped charge $Q_{ss}$ at the oxide interface. The sign of this trapped charge means that back interface leakage problems will be seen in the NMOS devices, if they are directly fabricated as SOI devices. However, if the trapped charge can be reduced, it would be possible to have the NMOS devices on the oxide and the PMOS devices in bulk, or even to have a mixed structure in which both NMOS and PMOS devices were found over the oxide. Although this is not presently believed to be desirable, it is a permitted embodiment of the invention.

It should be noted that the feature of depositing undoped polysilicon on the substrate, which is then doped to provide the desired channel doping, means that the substrate doping is not very important. That is, the substrate doping can essentially be selected primarily for gettering considerations. However, if the substrate is very heavily doped, then substrate dopants will migrate into the polysilicon layer during the annealing step.

Note that, in the presently preferred embodiment, lateral seeding is provided during the polysilicon annealing step. That is, the portion of the first polysilicon layer 16 which is directly in contact with the substrate 10 will freeze before the remainder of the layer 16, because silicon is so much better a thermal conductor then silicon oxide is. This portion of the layer 16, as is well known, will tend to freeze out epitaxially, i.e. into a silicon lattice which is aligned with a silicon lattice in the substrate 10. This crystalline portion of the layer will then laterally seed the remainder of the layer, so that a region of monocrystalline silicon will extend out onto the field oxide 14. This means that the channel regions 20 of the PMOS devices can be fabricated to be device quality.

Note that it may be desirable to impose a design limitation on the maximum distances between an active PMOS channel region 20 and the nearest boundary of a moat region 12, since the lateral seeding will not propagate single crystalline material across unlimited distances. However, regions of large-grain polycrystalline annealed silicon which are remote from the moat areas 12 can still be used e.g. for capacitor plates.

What is claimed is:

1. A CMOS integrated circuit, comprising:
    (a) a single crystal semiconductor substrate;
    (b) a field oxide defining a moat in said substrate;
    (c) a continuous layer of semiconductor material contacting said substrate and extending over said field oxide, said layer forming a single crystal extension of said substrate in the regions contiguous thereto and forming a semiconductor device quality portion in the regions contiguous to said field oxide;
    (d) an insulated gate field effect transistor formed in said extension of said substrate of a predetermined channel conductivity type;
    (e) an insulated gate field effect transistor formed in said layer over said field oxide of the opposite channel conductivity type; and
    (f) a source/drain region of one of said transistors being contiguous to a source/drain region of the other of said transistors.

2. A CMOS circuit as set forth in claim 1 wherein said predetermined channel conductivity type is N-type and said opposite channel conductivity type is P-type.

3. A CMOS circuit as set forth in claim 1 further including an insulating layer disposed over said transistors.

4. A CMOS circuit as set forth in claim 2 further including an insulating layer disposed over said transistors.

5. A CMOS circuit as set forth in claim 3 further including contact means extending through said insulating layer and contacting a said source/drain region thereunder.

6. A CMOS circuit as set forth in claim 4 further including contact means extending through said insulating layer and contacting a said source/drain region thereunder.

* * * * *